(12) United States Patent
Nishikawa

(10) Patent No.: US 10,254,799 B2
(45) Date of Patent: Apr. 9, 2019

(54) DISPLAY DEVICE AND METHOD FOR MANUFACTURING DISPLAY DEVICE

(71) Applicant: Japan Display Inc., Minato-ku (JP)

(72) Inventor: Hiromi Nishikawa, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/877,440

(22) Filed: Jan. 23, 2018

(65) Prior Publication Data

US 2018/0217640 A1 Aug. 2, 2018

(30) Foreign Application Priority Data

Jan. 30, 2017 (JP) .................................. 2017-014205

(51) Int. Cl.
| | | |
|---|---|---|
| G06F 1/16 | (2006.01) | |
| H01L 27/32 | (2006.01) | |
| H01L 51/00 | (2006.01) | |
| H01L 51/52 | (2006.01) | |

(52) U.S. Cl.
CPC .......... *G06F 1/1652* (2013.01); *G06F 1/1626* (2013.01); *H01L 27/3276* (2013.01); *H01L 51/0097* (2013.01); *H01L 51/524* (2013.01); *H01L 51/5253* (2013.01); *H01L 51/5256* (2013.01)

(58) Field of Classification Search
CPC . G06F 1/1652; G06F 1/1626; H01L 27/3276; H01L 51/524; H01L 51/5256; H01L 51/0097; H01L 2251/5338; H01L 51/5237; H01L 51/0096; H05B 33/04
See application file for complete search history.

(56) References Cited

U.S. PATENT DOCUMENTS

| | | | | |
|---|---|---|---|---|
| 9,363,342 | B2* | 6/2016 | Shin | G06F 1/1637 |
| 9,448,592 | B2* | 9/2016 | Jin | H01L 51/5253 |
| 9,671,823 | B2* | 6/2017 | Chang | G06F 1/1626 |
| 9,690,329 | B2* | 6/2017 | Jung | G09G 3/3225 |
| 9,697,764 | B2* | 7/2017 | Kim | H01L 51/52 |
| 2009/0244834 | A1 | 10/2009 | Sugimori et al. | |

(Continued)

FOREIGN PATENT DOCUMENTS

| | | |
|---|---|---|
| JP | 2009-246820 | 10/2009 |
| JP | 2013-15835 | 1/2013 |
| JP | 2016-31499 | 3/2016 |

*Primary Examiner* — Joseph L Williams
*Assistant Examiner* — Jose M Diaz
(74) *Attorney, Agent, or Firm* — Oblon, McClelland, Maier & Neustadt, L.L.P.

(57) ABSTRACT

A manufacturing method of a display device according to an embodiment of the present invention includes: a display panel forming process to provide a display panel includes the flexible base material, the plurality of pixels, and a display area, a display panel bending process to bend a part adjacent to the display area of the display panel and form a bent area, and arrange a part opposite to the display area with respect to the bent area to be opposed to the display area, a filling process to fill, by liquid adhesive, a space on the inner surface side that is in the bent area and that is the surface side of the display panel opposite to the surface on which the plurality of pixels are arranged on the flexible base material, and a curing process to cure the liquid adhesive and form an adhesive layer.

9 Claims, 12 Drawing Sheets

(56) References Cited

U.S. PATENT DOCUMENTS

| | | | |
|---|---|---|---|
| 2011/0007042 A1* | 1/2011 | Miyaguchi | G02F 1/133305 |
| | | | 345/204 |
| 2011/0050657 A1* | 3/2011 | Yamada | H01L 27/3293 |
| | | | 345/204 |
| 2013/0002133 A1 | 1/2013 | Jin et al. | |
| 2013/0063891 A1* | 3/2013 | Martisauskas | G06F 1/1643 |
| | | | 361/679.56 |
| 2014/0002385 A1* | 1/2014 | Ka | G06F 1/1601 |
| | | | 345/173 |
| 2014/0247405 A1 | 9/2014 | Jin et al. | |
| 2014/0340609 A1* | 11/2014 | Taylor | G02F 1/133308 |
| | | | 349/58 |
| 2016/0370827 A1 | 12/2016 | Jin et al. | |

* cited by examiner

DISPLAY DEVICE AND METHOD FOR MANUFACTURING DISPLAY DEVICE

CROSS-REFERENCE TO RELATED APPLICATION

The present application claims priority from Japanese Application JP 2017-014205 filed on Jan. 30, 2017, the content of which is hereby incorporated by reference into this application.

BACKGROUND OF THE INVENTION

1. Field of the Invention

One or more embodiments of the present invention relate to a display device and a manufacturing method thereof.

2. Description of the Related Art

Recent years, in order to downsize a display device or to expand a display area that displays an image, it is demanded to narrow down what is called a frame area that exists in the periphery of the display area (i.e., to attain a narrow frame). In particular, as to a mobile device such as a smartphone the demand for a narrow frame is getting bigger.

As an example of an effort to have a narrow frame, Japanese Patent Application Laid-Open No. 2016-031499 discloses a display device that includes a film-like base material having flexibility, a display element provided on the base material, and a wiring that is connected to the display element. The display device has a bent part and a non-bent part, and the wiring is arranged in the range from the non-bent part to the bent part. Like this, by providing the bent part at a part of the display device, they try to have a narrow frame.

SUMMARY OF THE INVENTION

However, as to the conventional display device, there is a fear that when an external stress is applied to the bent part, the flexible base material may be deformed, which damages the wiring.

The present disclosure was made in view of the above problem, and the object thereof is to reduce the damage to the wiring that occurs when an external stress is applied to the bent part of the display device.

A manufacturing method of a display device according to an embodiment of the present invention includes: a display panel forming process to provide a plurality of pixels on a flexible base material and form a display area, and form a display panel that is provided with the flexible base material and the plurality of pixels and has a display area, a display panel bending process to bend a part adjacent to the display area of the display panel and form a bent area, and arrange a part opposite to the display area with respect to the bent area to be opposed to the display area and form a backside area, a filling process to fill, by liquid adhesive, a space on the inner surface side that is in the bent area and that is the surface side of the display panel opposite to the surface on which the plurality of pixels are arranged on the flexible base material, and a curing process to cure the liquid adhesive and form an adhesive layer.

In one embodiment of the present invention, the filling process includes: a protecting sheet bonding process to bond a lateral surface protecting sheet to both lateral surfaces of the display panel, and an injecting process to inject the liquid adhesive into the space on the inner surface side after the protecting sheet bonding process.

In one embodiment of the present invention, the injecting process includes: arranging an opening of an opposition space between the display area and the backside area that are opposed to each other to face upward, and injecting the liquid adhesive into the space on the inner surface side through the opening.

In one embodiment of the present invention, the lateral surface protecting sheet is bonded to at least a whole of a part positioned in the bent area, the part positioned in the bent area being included in the both lateral surfaces.

In one embodiment of the present invention, the filling process includes: a protecting sheet bonding process to bond a lateral surface protecting sheet to a first lateral surface of the display panel and bond an opening part protecting sheet to an opening of an opposition space between the display area and the backside area that are opposed to each other to seal the opening, and an injection process to inject the liquid adhesive into the space on the inner surface side after the protecting sheet bonding process.

In one embodiment of the present invention, the display panel has a second lateral surface that is opposed to the first lateral surface, and the injection process includes: arranging the second lateral surface to face upward, and injecting the liquid adhesive into the space on the inner surface side from a side where the second lateral surface exists.

In one embodiment of the present invention, the lateral surface protecting sheet is bonded to at least a whole of a part positioned in the bent area, the part positioned in the bent area being included in the first lateral surface.

In one embodiment of the present invention, further includes: a bonding process to dispose a double sided adhesive tape in an opposition space between the display area and the backside area that are opposed to each other, and bond the display area and the backside area to each other, after the display panel bending process.

In one embodiment of the present invention, further includes: disposing a first protecting film on a side of the display area opposed to the backside area, and disposing a second protecting film on a side of the backside area opposed to the display area, the double sided adhesive tape bonds the first protecting film and the second protecting film to each other.

In one embodiment of the present invention, the filling process includes: a protecting sheet bonding process to bond a lateral surface protecting sheet to a first lateral surface of the display panel, and an injection process to inject the liquid adhesive into the space on the inner surface side after the protecting sheet bonding process.

In one embodiment of the present invention, the display panel has a second lateral surface opposed to the first lateral surface, and the injecting process includes: arranging the second lateral surface to face upward, and injecting the liquid adhesive into the space on the inner surface side from a side where the second lateral surface exists.

In one embodiment of the present invention, the lateral surface protecting sheet is bonded to at least a whole of a part positioned in the bent area, the part positioned in the bent area being included in the first lateral surface.

In one embodiment of the present invention, thermosetting resin is used as the liquid adhesive in the filling process, and the liquid adhesive is heated in the curing process.

In one embodiment of the present invention, ultraviolet curable resin is used as the liquid adhesive in the filling process, and ultraviolet ray is irradiated onto the liquid adhesive in the curing process.

In one embodiment of the present invention, ultraviolet curable resin is used as the liquid adhesive in the filling process, ultraviolet ray is irradiated onto the liquid adhesive in the curing process, and an ultraviolet ray transmitting material is used for the lateral surface protecting sheet in the protecting sheet bonding process.

In one embodiment of the present invention, further includes: a cutting process to cut off apart of the adhesive layer that extends farther than a lateral surface of the display panel after the curing process.

A display device according to an embodiment of the present invention includes: a display panel provided with a flexible base material and a plurality of pixels disposed on the flexible base material, and an adhesive layer that fixes the display panel in a bent state, the display panel includes: a display area that includes the plurality of pixels, a bent area that is adjacent to the display area and is bent, and a backside area that is positioned on a side opposite to the display area with respect to the bent area and is opposed to the display area, the bent area has an inner surface that is a surface positioned opposite from the plurality of pixels of the flexible base material, and the adhesive layer is adjacent to the inner surface and is positioned between the display area and the backside area.

In one embodiment of the present invention, a first protecting film is positioned on a side of the display area opposed to the backside area, a second protecting film is positioned on a side of the backside area opposed to the display area, and the adhesive layer is adjacent to the first protecting film and the second protecting film.

In one embodiment of the present invention, further includes: a double sided adhesive tape that is positioned between the first protecting film and the second protecting film, and bonds the first protecting film and the second protecting film to each other, the adhesive layer is adjacent to an end part of the inner surface side of the first protecting film, an end part of the inner surface side of the second protecting film, and an end part of the inner surface side of the double sided adhesive tape.

DETAILED DESCRIPTION OF THE INVENTION

First Embodiment

Figure 1:
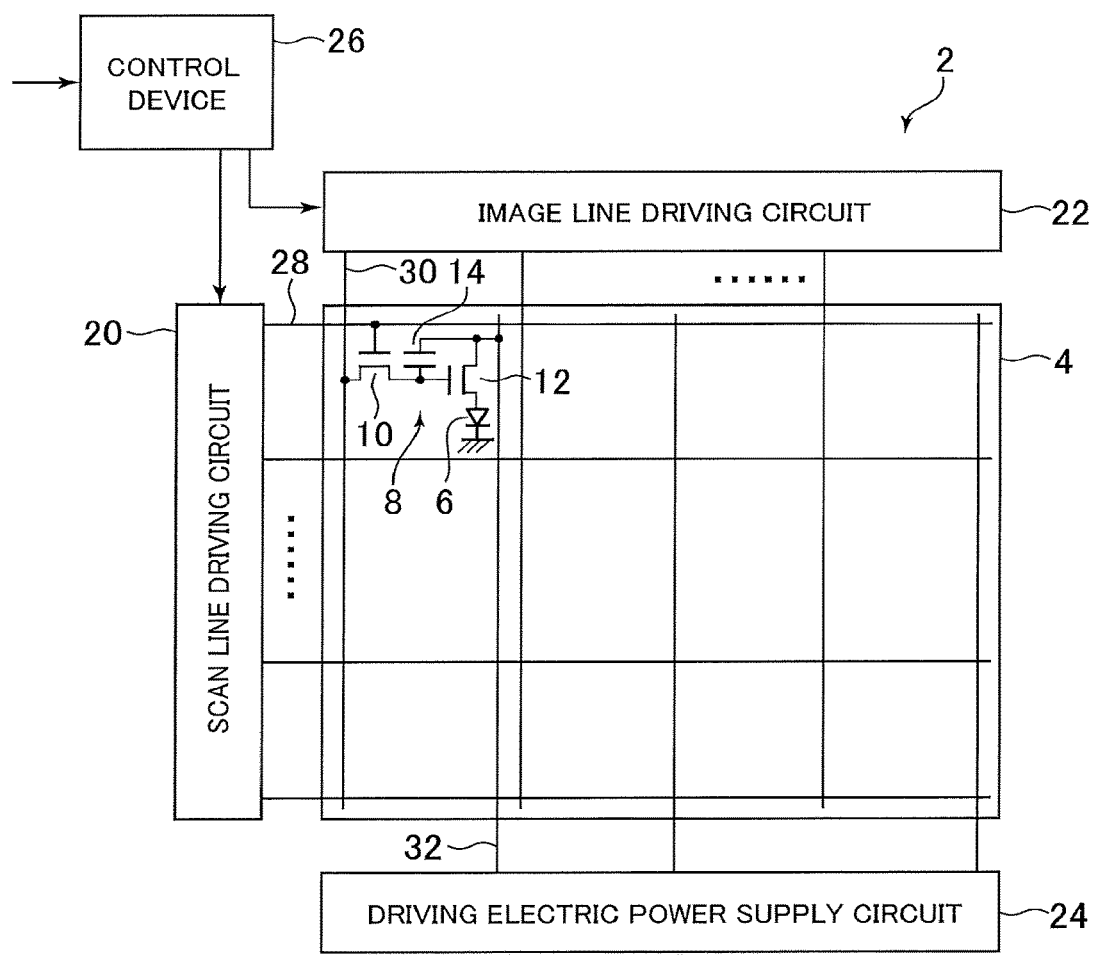
FIG. 1 is a schematic diagram that illustrates a schematic configuration of a display device according to the present disclosure.

Below, embodiments of the present disclosure are explained with reference to the accompanying drawings.

Note that the present disclosure is merely an example, and an appropriate variation that a person skilled in the art can easily arrive at without departing from the spirit of the invention is naturally included in the scope of the present invention. Further, while the width, thickness, shape, and the like of each element in the drawings may be illustrated schematically as compared with actual embodiments in order to clarify the explanation, this is merely an example and an interpretation of the present invention should not be limited thereto. Furthermore, in the specification and the respective drawings, the same reference symbols may be applied to elements similar to those that have already been illustrated in another drawing and a detailed explanation of such elements may be omitted as appropriate.

A display device 2 according to an embodiment of the present disclosure is, for example, an organic electroluminescence display device, and is installed in a television, a personal computer, a mobile terminal, a cellar phone, and the like. FIG. 1 is a schematic diagram that illustrates a schematic configuration of the display device 2 according to the embodiment. The display 2 is provided with a pixel array part 4 that displays an image, and a driving part that drives the pixel array part 4. The display device 2 is a flexible display, and has a wiring layer that includes a base material made of a resin film and the like that have a flexibility and a wiring provided inside or over the base material.

On the pixel array part 4, an organic light emitting diode and a pixel array circuit 8 are arranged in a matrix, corresponding to a pixel. The pixel circuit 8 includes a lighting TFT (thin film transistor) 10, a driving TFT 12, a capacitor 14, and the like.

Whereas, the driving part includes a scan line driving circuit 20, an image line driving circuit 22, a driving electric power supply circuit 24, and a control device 26, drives the pixel circuit 8, and controls light emission of the organic light emitting diode 6.

The scan line driving circuit 20 is connected to a scan signal line 28 provided for each horizontal line of pixels (pixel row). The scan line driving circuit 20 selects scan signal lines 28 in order according to timing signals input from the control device 26, and applies an electric voltage for turning on the light emitting TFT 10 to the selected scan signal line 28.

The image line driving circuit 22 is connected to an image signal line 30 provided for each vertical line of pixels (pixel column). The image line driving circuit 22 receives an input of an image signal from the control device 26, and in accordance with the selection of the scan signal line 28 by the scan line driving circuit 20, outputs an electric voltage according to an image signal for the selected pixel row to each image signal line 30. That electric voltage is written into the capacitor 14 via the lighting TFT 10 in the selected pixel row. The driving TFT 12 supplies the organic light emitting diode 6 with an electric current according to the written electric voltage, and thus the organic light emitting diode 6 of the pixel that corresponds to the selected scan signal line 28 emits light.

The driving electric power supply circuit 24 is connected to a driving electric power supply line 32 provided for each pixel column, and supplies the organic light emitting diode 6 with an electric current via the driving electric power supply line 32 and the driving TFT 12 of the selected pixel row.

Here, a lower electrode of the organic light emitting diode 6 is connected to the driving TFT 12. Whereas, an upper electrode of each organic light emitting diode 6 is composed of an electrode commonly shared by the organic light emitting diodes 6 of all the pixels. In a case where the lower electrode is configured as an anode, a high electric potential is input thereto, and the upper electrode becomes a cathode and a low electric potential is input thereto. In a case where the lower electrode is configured as an cathode, a low electric potential is input thereto, and the upper electrode becomes an anode and a high electric potential is input thereto.

Figure 2:
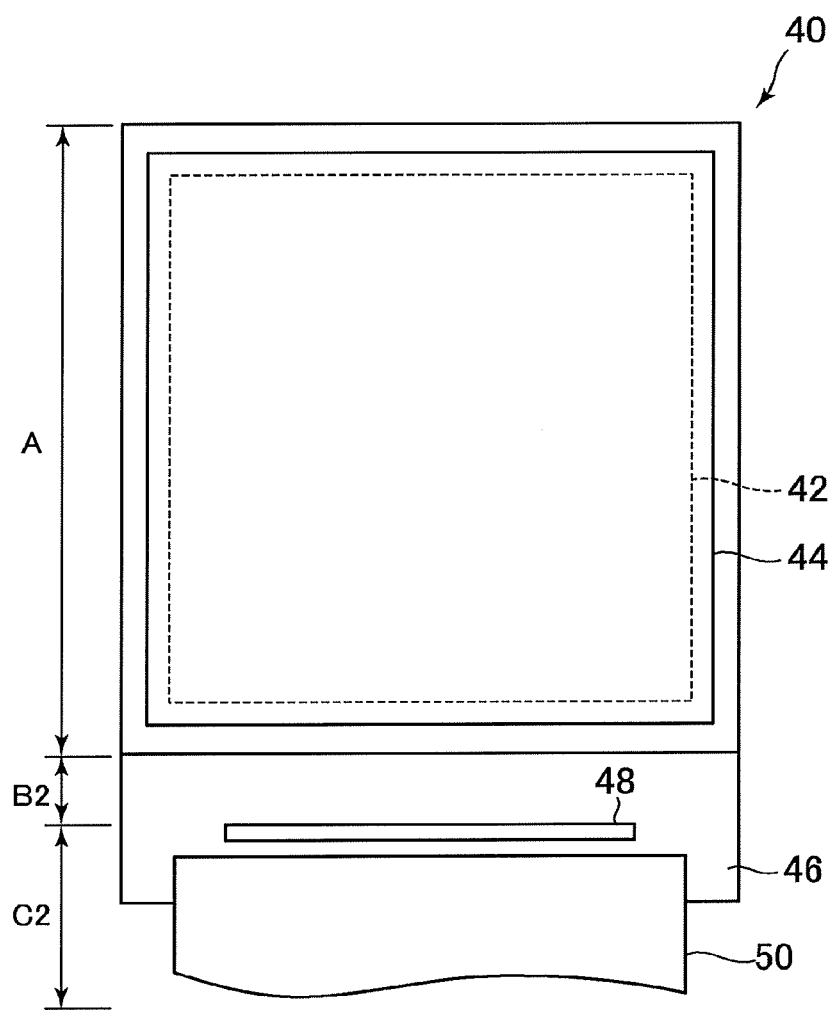
FIG. 2 is a schematic planar diagram of a display panel of the display device according to the present disclosure.

FIG. 2 is a schematic planar diagram of the display panel 40 of the display device 2. The display device 40 has a display area A, a to-be-bent area B2 connected to the display area A, and a to-be-on-a-backside area C2 connected to the to-be-bent area B2.

A display element 42 is disposed in the display area A of the display panel 40, and the display element 42 includes the pixel array part 4, the organic light emitting diode 6, and the pixel circuit 8 illustrated in FIG. 1. That is, the display element 42 illustrated in FIG. 2 includes a plurality of pixels positioned in the pixel array part 4, and a light emitting element including the organic light emitting diode 6 is provided for each of the plurality of pixels. A polarizing plate 44 is disposed over the display element 42. The polarizing plate 44 is, for example, a circularly polarizing plate. Between the display element 42 and the polarizing plate 44, a protection film may be disposed.

In the to-be-bent area B2 and the to-be-on-a-backside area C2 of the display panel 40, a component mounting area 46 is provided, and a wiring and a terminal are disposed thereon that are electrically connected to the display element 42. Further, on the element mounting area 46 a driver IC (integrated circuit) 48 is mounted that constitutes the driving part, and to the element mounting area 46 an FPC (flexible printed circuits) 50 is connected. The FPC 50 is connected to the control device 26, the scan line driving circuit 20, the image line driving circuit 22, the driving electric power supply circuit 24, and the like, and on the FPC 50 an IC is mounted.

When the display panel 40 is placed inside a housing of the display device 2, by folding the to-be-bent area B2 back, the to-be-on-a-backside area C2 is arranged on the backside of the display area A, and the to-be-on-a-backside area C2 is opposed to at least a part of the display area A.

Figure 3:
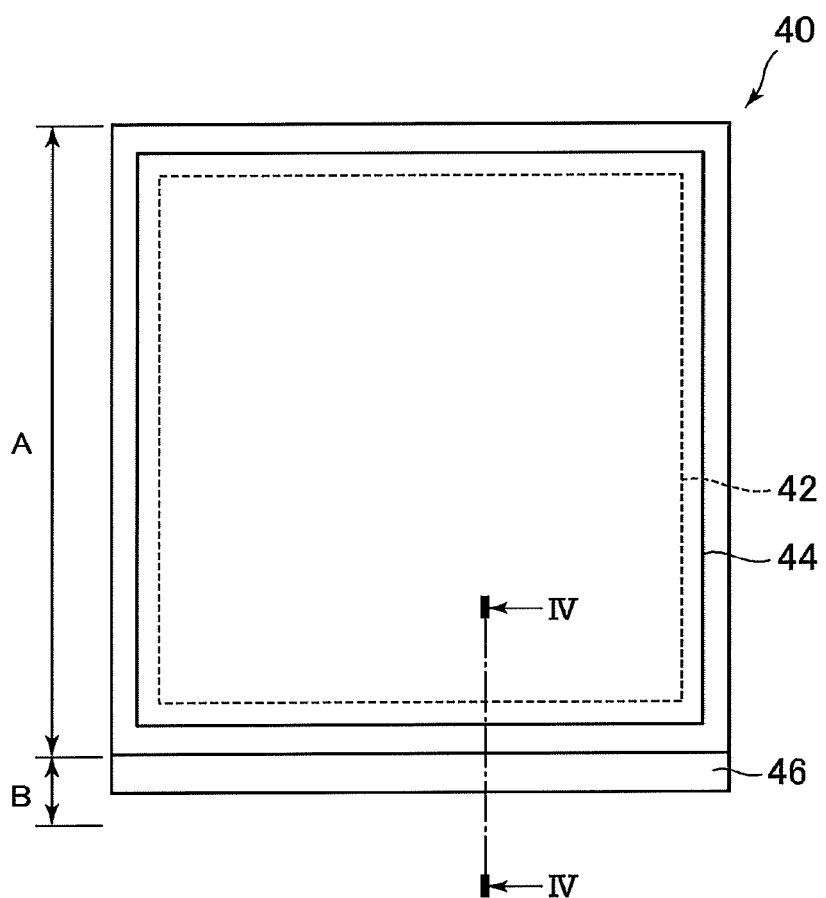
FIG. 3 is a schematic planar diagram of the display panel of the display device according to the present disclosure.

FIG. 3 is a schematic planar diagram of the display panel 40 after the formation of the bent area B. Since the display panel 40 is folded back at the bent area B, only a part of the element mounting area 46 is illustrated.

Figure 4:
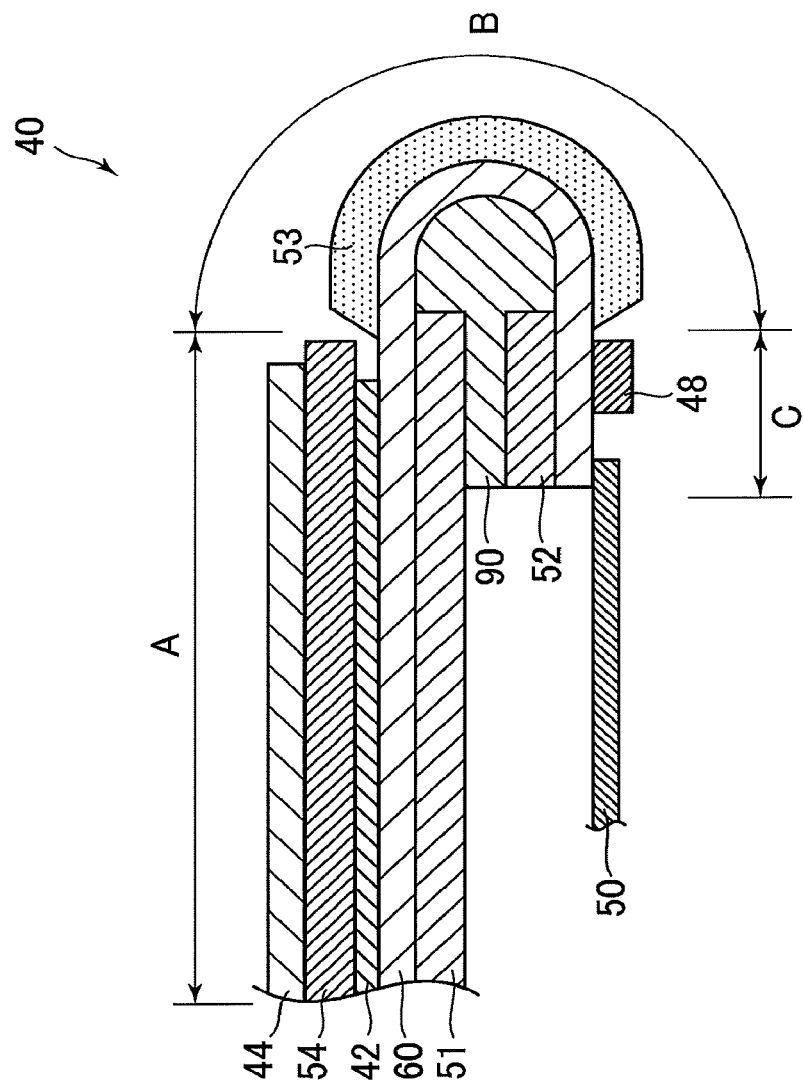
FIG. 4 is a schematic vertical cross-sectional diagram of the display panel of the display device according to the present disclosure.

FIG. 4 is a schematic vertical cross-sectional diagram of the display panel 40 after the formation of this bent area B, and illustrates the cross section that is along the IV-IV line given in FIG. 3. Here, a surface in the display area A that is opposed to the backside area C is defined as an inner surface in the display area A, and a surface in the backside area C that is opposed to the display area A is defined as an inner surface in the backside area C. Further, a surface in the bent area B that faces toward the center of the whole display panel 40 is defined as an inner surface in the bent area B.

The display panel 40 has a wiring layer 60 as described above, and the wiring layer 60 includes a flexible base material and a wiring provided inside or over this flexible base material. This wiring layer 60 is provided over the display area A, the bent area B, and the backside area C. The inner surface side of the wiring layer 60 in the display area A and the inner surface side of the wiring layer 60 in the backside area C are opposed to each other.

On the outer surface side of the wiring layer 60 in the display area A, the display element 42 is provided. The display element 42 has the pixel array part 4 illustrated in FIG. 1, and has the pixel circuits 8 and the organic light emitting diodes 6 to emit light in red, green, or blue that correspond to the respective pixels. The organic light emitting diode 6 and the pixel circuit 8 of the display element 42 are electrically connected to the wiring of the wiring layer 60.

On the inner surface side of the wiring layer 60 in the display area A, a first protecting film 51 is provided, and the first protecting film 51 protects the inner surface side of the wiring layer 60 in the display area A. As for the first protecting film 51, a laminate film or the like made of photosensitive acrylic resin, silicone, polyethylene terephthalate (PET) or the like can be used, for example.

On the inner surface side of the wiring layer 60 in the backside area C, a second protecting film 52 is provided, and the second protecting film 52 protects the inner surface side of the wiring layer 60 in the backside area C. As for the second protecting film 52, a material that is used for the first protecting film 51 may be used.

In the bent area B, the wiring layer 60 is bent. On the outer surface side of the bent wiring layer 60, a third protecting film 53 is provided, and the third protecting film 53 protects the outer surface side of the wiring layer 60 in the bent area B. As for the third protecting film 53, a material that is used for the first protecting film 51 may be used. Further, instead of the third protecting film 53, a resin film may be provided. It may be configured that the third protecting film 53 or the resin film is provided not only in the bent area B, but is provided also in a part of the display area A adjacent to the bent area B and a part of the backside area C seamlessly from the bent area B.

On the outer surface side of the display element 42, a fourth protecting film 54 is provided, and the fourth protecting film 54 protects the display element 42 and the wiring layer 60. As for the fourth protecting film 54, a material that is used for the first protecting film 51 can be used. On the outer surface side of the fourth protecting film 54, the polarizing plate 44 is provided.

Note that the third protecting film 53 and the fourth protecting film 54 may be formed as a single protecting film. Meanwhile, it is preferable to form the third protecting film 53 and the fourth protecting film 54 separately, since a pulling stress applied to the outer surface side of the third protecting film 53 in the bent area B can be reduced, and a break of the wiring in the wiring layer 60 can be prevented.

On the outer surface side of the wiring layer 60 in the backside area C, as described above, the driver IC 48 and the FPC 50 are disposed, and are electrically connected to the wiring of the wiring layer 60.

Further, a space on the inner surface side of the wiring layer 60 in the bent area B is filled by an adhesive layer 90. In the present embodiment, the adhesive layer 60 is provided in the range from the space on the inner surface side of the wiring layer 60 in the bent area B to an opposition space between the first protecting film 51 and the second protecting film 52 that are opposed to each other, but it is sufficient if the adhesive layer 90 at least fills the space on the inner surface side of the wiring layer 60 in the bent area B.

Since the space on the inner surface side of the wiring layer 60 in the bent area B is filled by the adhesive layer 90, deformation of the display device 2 at the time when the stress is applied from the outer surface side of the bent area B can be suppressed, and thus the damage to the wiring layer 60 can be reduced.

Figure 12:
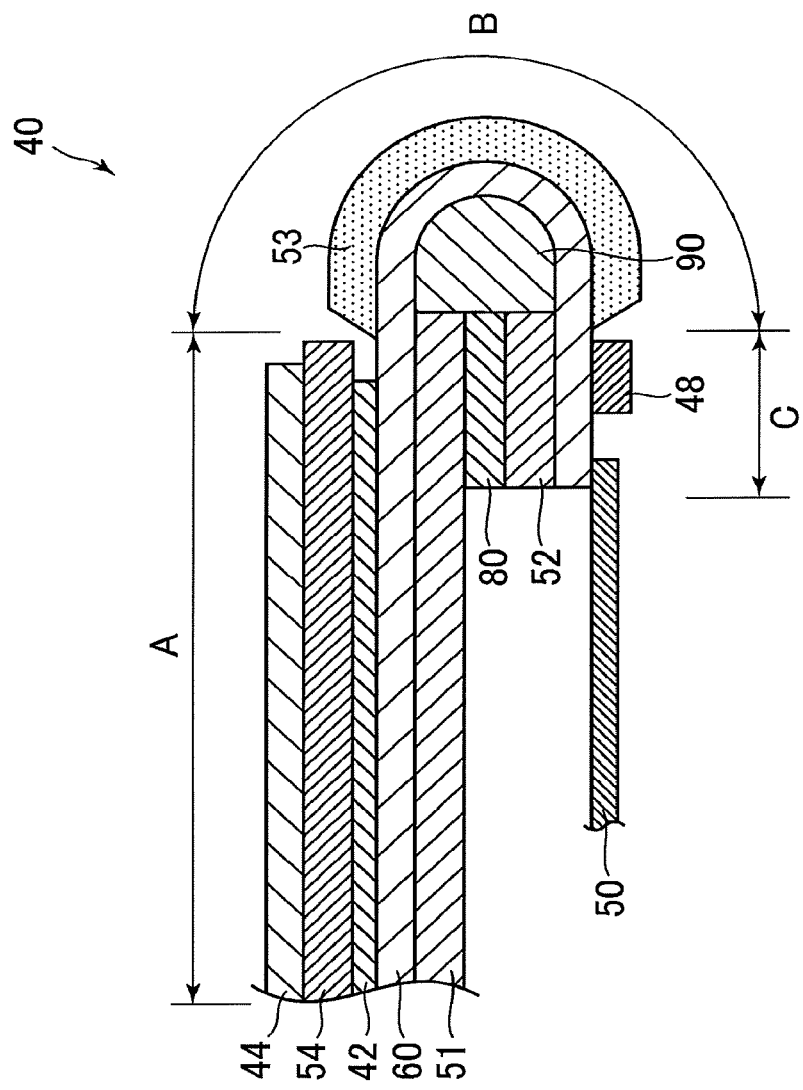
FIG. 12 is a schematic vertical cross-sectional diagram of the display panel of the display device according to the present disclosure.

Note that it may be configured that as illustrated in FIG. 12, a double sided adhesive tape 80 is provided in an opposition space between the inner surface side of the wiring layer 60 in the display area A and the inner surface side of the wiring layer 60 in the backside area C that are opposed to each other. The width of the double sided adhesive tape 80 is equivalent to or larger than those of the first protecting film 51 and the second protecting film 52, and an opening of the opposition space between the display area A and the backside area C is sealed.

[First Manufacturing Method]

Subsequently, with reference to FIGS. 5-8, a first manufacturing method of the display device according to the present embodiment is explained. FIGS. 5-8 are side view diagrams that illustrate a manufacturing method of the display device according to the present embodiment.

Figure 5:
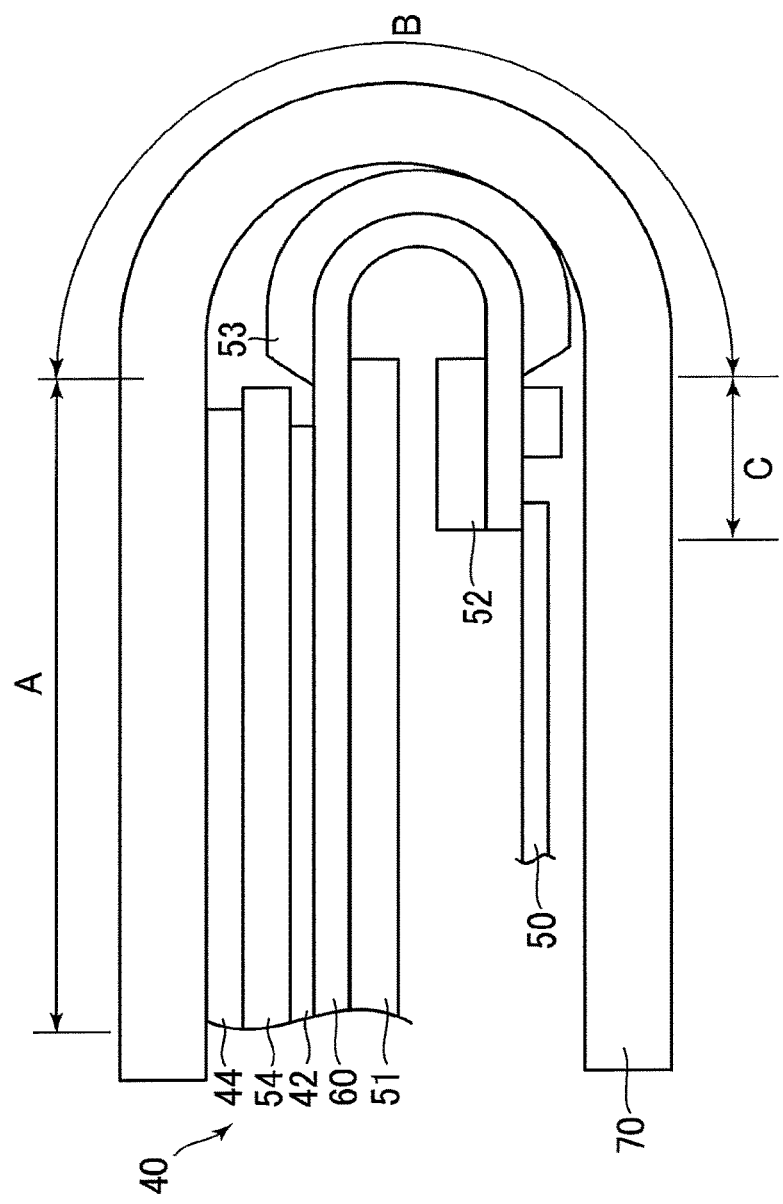
FIG. 5 is a side view diagram that illustrates a first manufacturing method of the display device according to the present disclosure.

A first process is a preparatory process to prepare the display panel 40 that has the display area A that displays an image, the backside area C that is opposed to at least a part of the display area A, and the bent area B that connects the display area A and the backside area C. As illustrated in FIG. 2, by making a bending jig 70 as illustrated in FIG. 5 contact with the outer surface side of the display panel 40 where the display area A, the to-be-bent area B2, and the to-be-a-backside area C2 exist on the same plane, and bending this bending jig 70, the display panel 40 is bent in the bent area B. Due to this process, the backside area C and at least a part of display area A are opposed to each other, and the display panel 40 can be prepared that has the bent area B to connect the display area A and the backside area C.

The second process is a filling process to fill the space on the inner surface side of the wiring layer 60 in the bent area B with liquid adhesive 92. This filling process includes a protecting sheet bonding process and a liquid adhesive injecting process.

Figure 6:
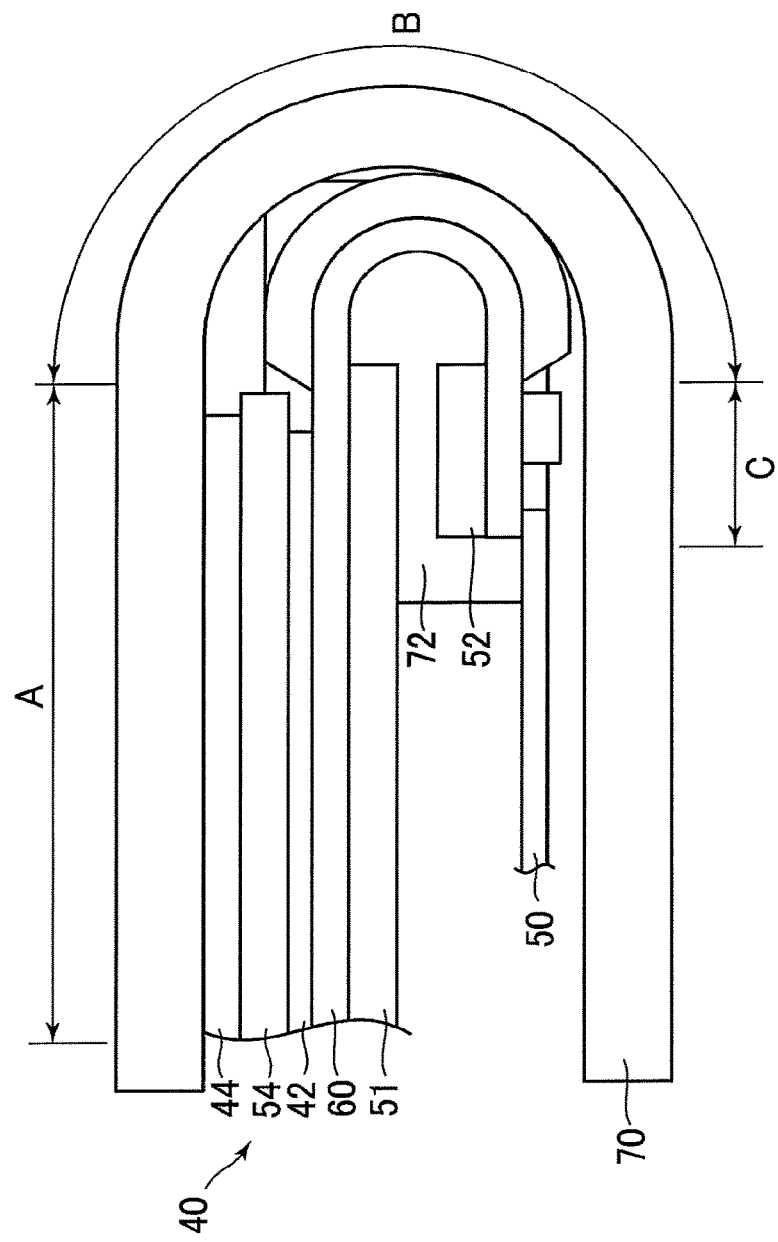
FIG. 6 is a side view diagram that illustrates the first manufacturing method of the display device according to the present disclosure.

In the protecting sheet bonding process, as illustrated in FIG. 6, a lateral surface protecting sheet 72 is bonded to the both of lateral surfaces of the display panel 40. Note that in this FIG. 6, for convenience of explanation, the lateral surface protecting sheet 72 on one lateral surface side of the display device 40 is not illustrated. The lateral surface protecting sheet 72 is bonded thereto such that it at least covers the lateral surface of the wiring layer 60 disposed in the bent area B. In the present embodiment, it is bonded thereto such that it covers the range from the lateral surface of the wiring layer 60 disposed in the bent area B to the lateral side of the opposition space between the first protecting film 51 and the second protecting film 52 that are opposed to each other.

Figure 7:
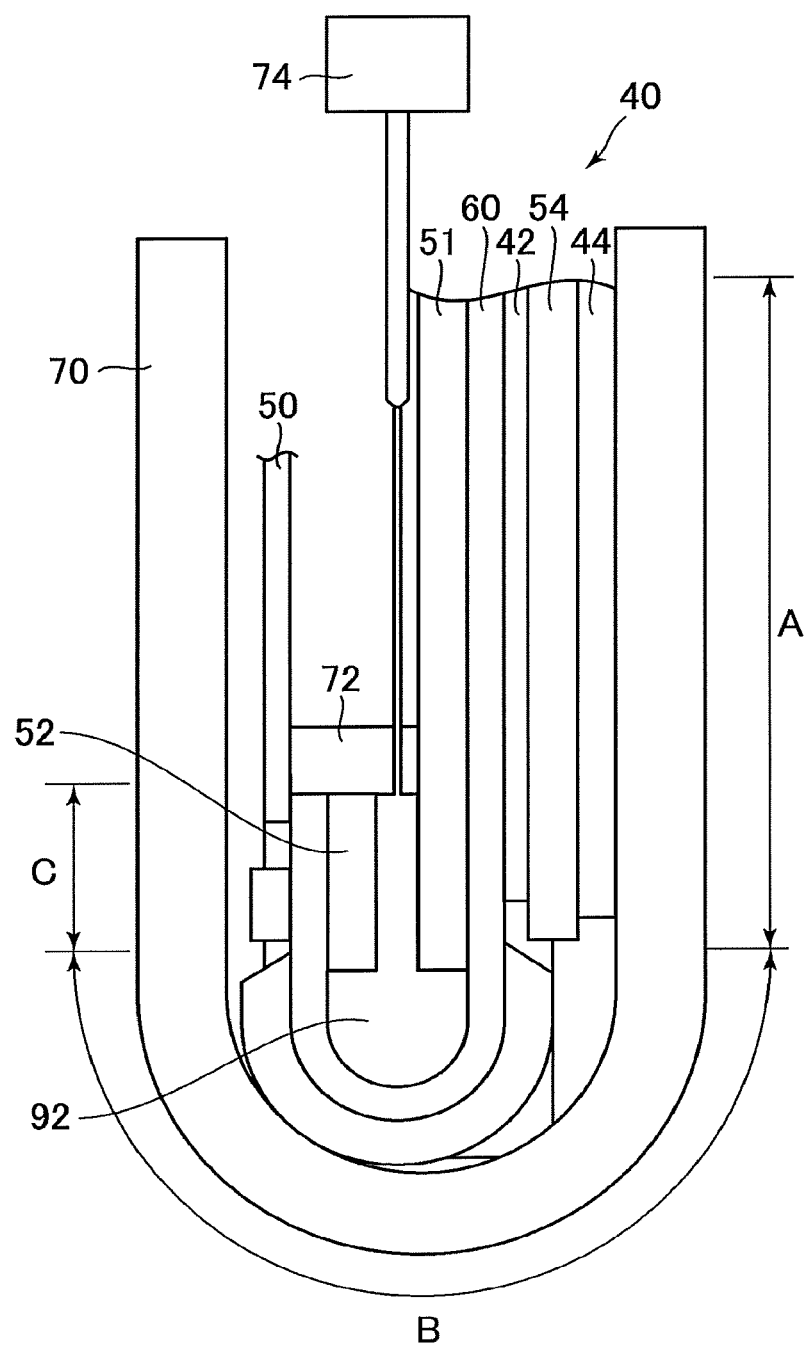
FIG. 7 is a side view diagram that illustrates the first manufacturing method of the display device according to the present disclosure.

In the liquid adhesive injecting process, as illustrated in FIG. 7, the opening of the opposition space between the display area A and the backside area C that are opposed to each other is arranged to face upward, and the liquid adhesive 92 is injected by a resin injection nozzle 74 from this opening side into the space on the inner surface side of the wiring layer 60 in the bent area B. In the present embodiment, the liquid adhesive 92 is injected so that it is distributed in the range from the space on the inner surface side of the wiring layer 60 in the bent area B and to the opposition space between the first protecting film 51 and the second protecting film 52 that are opposed to each other, but it is sufficient if the liquid adhesive 92 is injected so as to at least fill the space on the inner surface side of the wiring layer 60 in the bent area B. Note that in this FIG. 7, for convenience of explanation of the resin injection nozzle 74 and the liquid adhesive 92, the lateral surface protecting sheet 72 on one lateral surface side of the display panel 40 is not illustrated. As the liquid adhesive 92 to be injected, thermosetting resin or ultraviolet curable resin can be used. As the thermosetting resin, epoxy resin, phenol resin, and silicone can be mentioned.

The third process is a curing process to cure the adhesive. In a case where in the liquid adhesive injecting process as described above the thermosetting resin is used as the liquid adhesive 92, by heating the whole of the display panel 40 or the liquid adhesive 92 filled part, the liquid adhesive 92 is cured, and the adhesive layer 90 illustrated in FIG. 4 can be formed. In a case where ultraviolet curable resin is used as the liquid adhesive 92, by irradiating ultraviolet ray from the lateral surface protecting sheet 72 side or the like, the liquid adhesive 92 can be cured. In a case where the ultraviolet ray is irradiated from the lateral surface protecting sheet 72 side, it is preferable that the lateral surface protecting sheet 72 is formed of light transmitting material.

Lastly, by peeling off the lateral surface protecting sheet 72 and removing the bending jig 70, the display panel 40 illustrated in FIG. 4 can be obtained. According to this manufacturing method, the configuration can be realized where the adhesive layer 90 fill the space on the inner surface side of the wiring layer 60 in the bent area B, and even when a stress is asserted thereon from the outer surface side of the bent area B, the deformation of the display device 2 can be suppressed, and the damage to the wiring layer 60 can be reduced. Further, even if downsizing of the display device 2 is advanced and the form of the inner surface side of the bent area B is miniaturized, the adhesive layer 90 that fits into that form can be formed.

Figure 8:
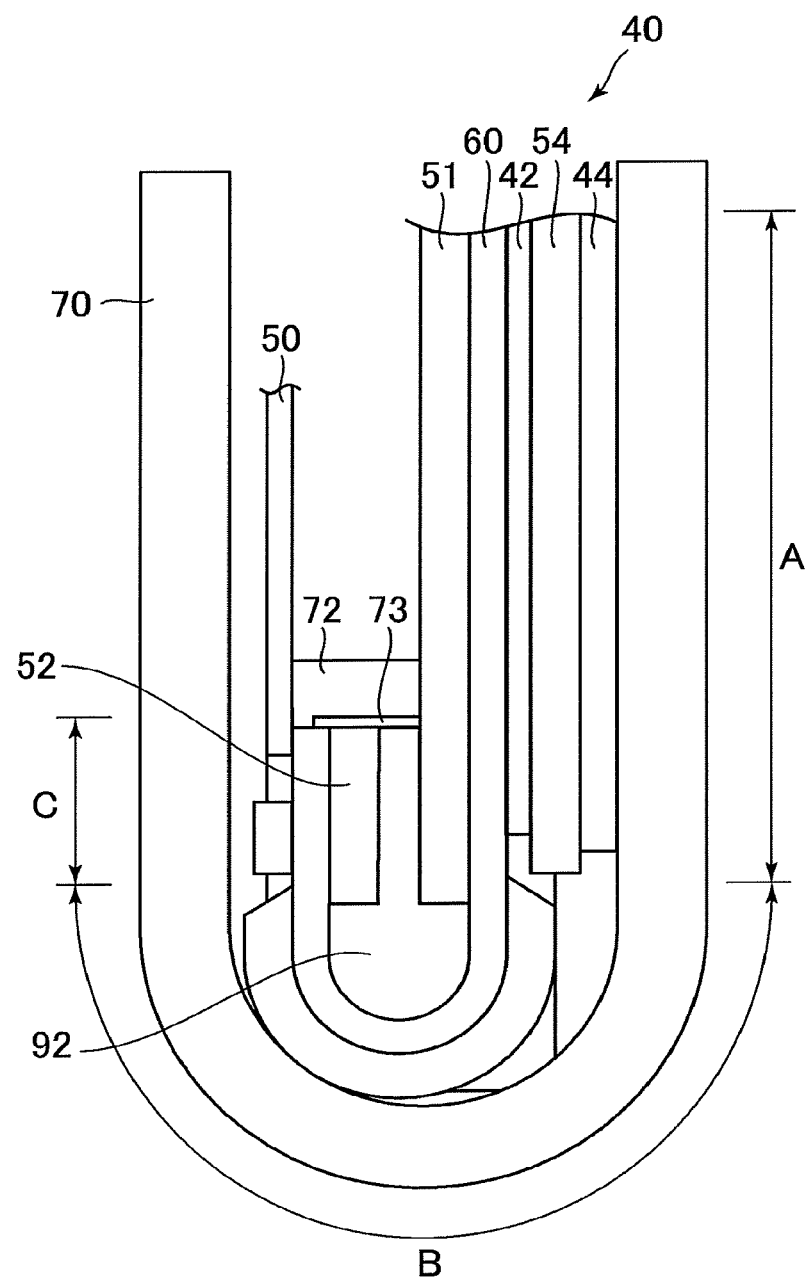
FIG. 8 is a side view diagram that illustrates the first manufacturing method of the display device according to the present disclosure.

Note that in the liquid adhesive injection process, the manufacturing method may be changed to the one where the lateral surface of the display panel 40 is arranged to face upward. In that case, as illustrated in FIG. 8, an opening part protecting sheet 73 is provided that seals the opening of the opposition space between the inner surface side of the wiring layer 60 in the display area A and the inner surface side of the wiring layer 60 in the backside area C that are opposed to each other, and the lateral surface protecting sheet 72 is provided only on a first lateral surface side of the display panel 40. The lateral surface protecting sheet 72 is not provided on a second lateral surface side of the display panel 40, and it is sufficient if the liquid adhesive 92 is injected from this second surface side of the display panel 40.

In a case where the liquid adhesive 92 that is highly viscous is used in the filling process as described above, it may be configured that the liquid adhesive 92 is injected without providing a protecting sheet bonding process, and after the curing process a cutting process is provided where the adhesive layer 90 that extends farther than the lateral surface of the wiring layer 60, and the adhesive layer 90 that extends farther than the opposition space between the first protecting film 51 and the second protecting film 52 that are opposed to each other are cut off. In that case, the process to peel off the lateral surface protecting sheet 72 and the opening part protecting sheet 73 carried out after the curing process is unnecessary.

[Second Manufacturing Method]

Figure 9:
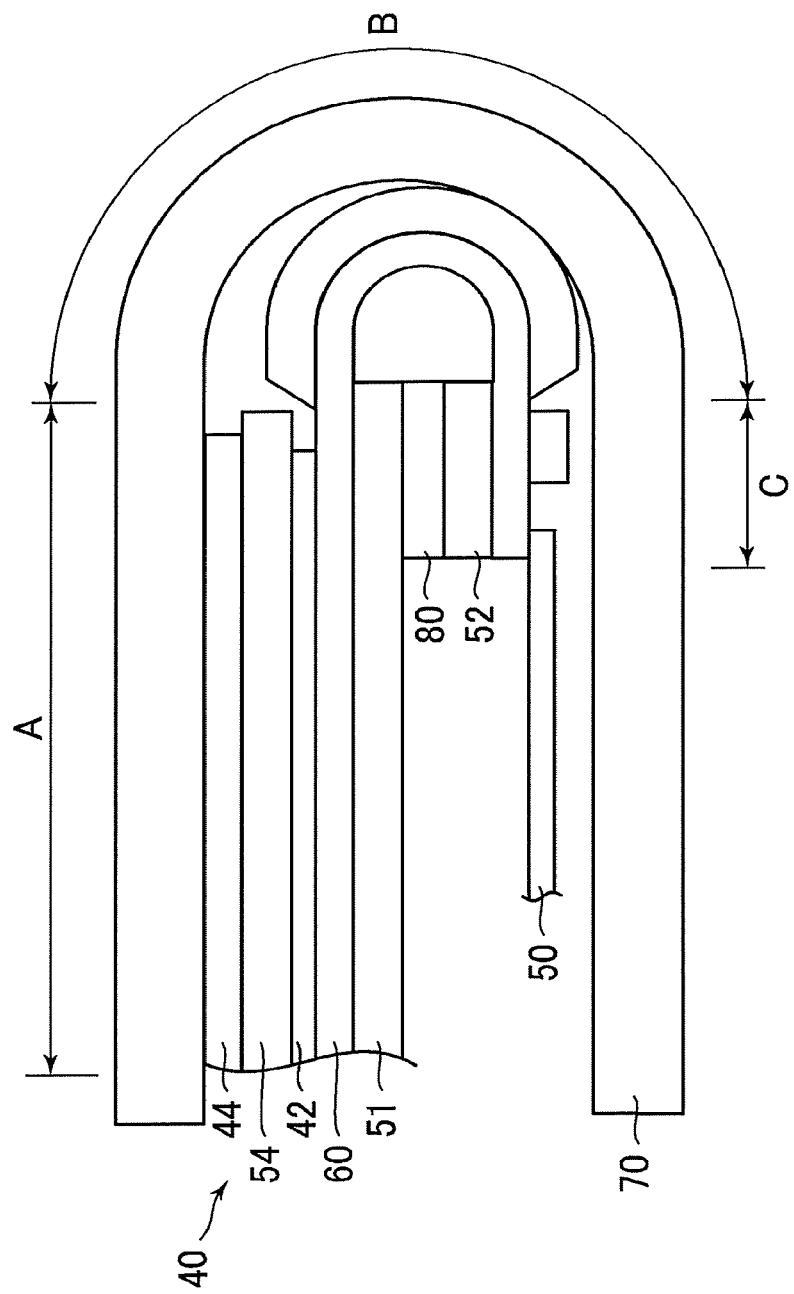
FIG. 9 is a side view diagram that illustrates a second manufacturing method of the display device according to the present disclosure.
Figure 10:
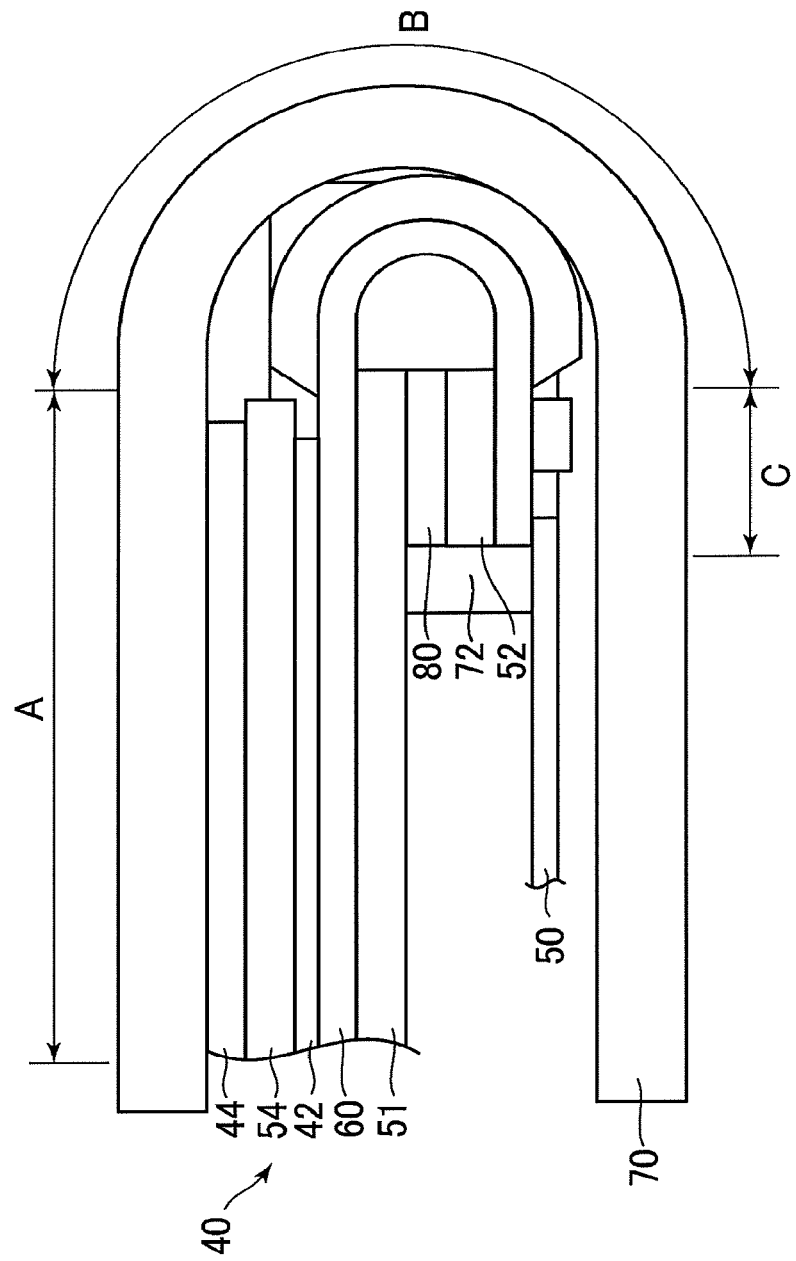
FIG. 10 is a side view diagram that illustrates the second manufacturing method of the display device according to the present disclosure.
Figure 11:
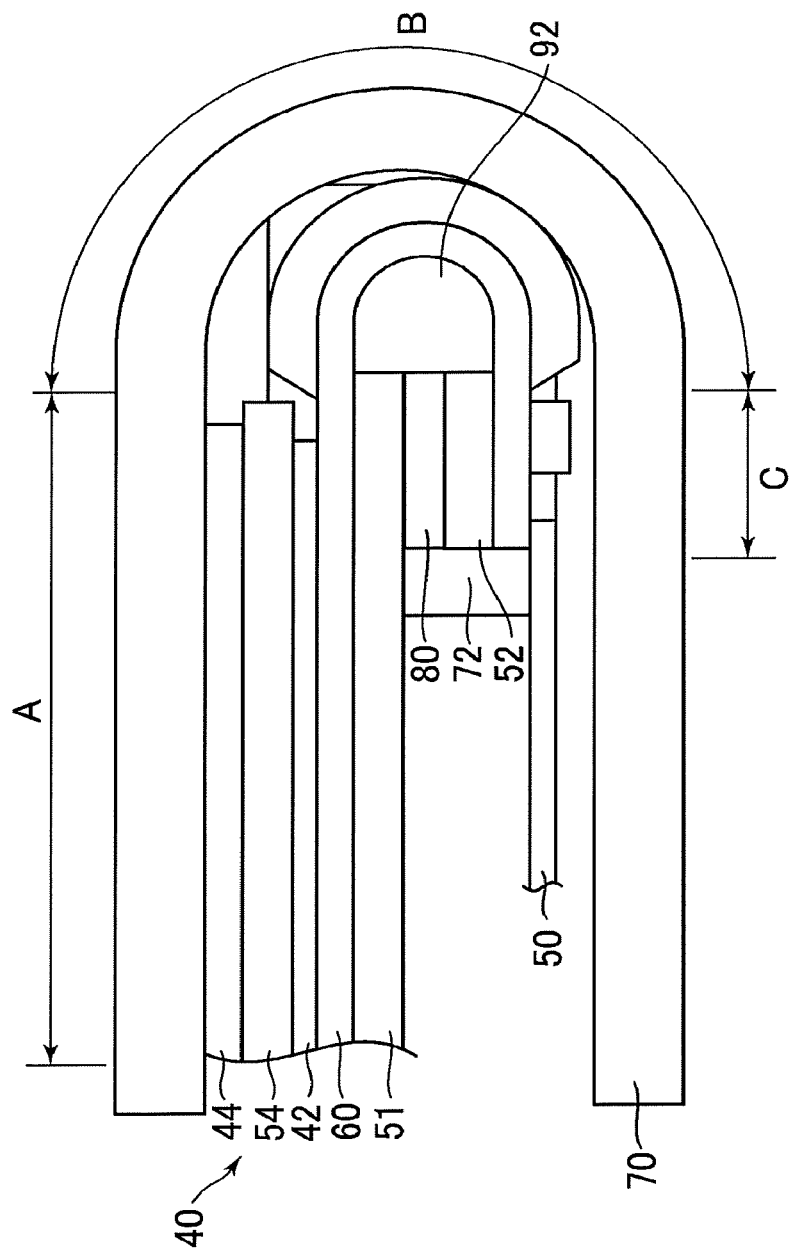
FIG. 11 is a side view diagram that illustrates the second manufacturing method of the display device according to the present disclosure.

Subsequently, with reference to FIGS. 9-11, a second manufacturing method of the display device according to the present embodiment is explained. FIGS. 9-11 are side view diagrams that illustrate the manufacturing method of the display device according to the present embodiment.

The first process is a preparatory process to prepare the display panel 40 that has the display area A that displays an image, the backside area C that is opposed to at least a part of the display area A, and the bent area B that connects the display area A and the backside area C. The point that the second manufacturing method is different from the first manufacturing method with respect to this preparatory process is that as illustrated in FIG. 9 the display panel 40 has the double sided adhesive tape 80 in the opposition space between the first protecting film 51 and the second protecting film 52 that are opposed to each other. By bonding the double sided adhesive tape 80 to one of the first protecting film 51 and the second protecting film 52 in advance, and bending the display panel 40, this double sided adhesive tape 80 is inserted into the opposition space between the first protecting film 51 and the second protecting film 52 that are opposed to each other. In other words, the display area A and the backside area C are bonded to each other by the double sided adhesive tape 80. Here, the double sided adhesive tape 80 seals the opening of the opposition space between the first protecting film 51 and the second protecting film 52 that are opposed to each other. That is, the double sided adhesive tape 80 seals the opening of the opposition space between the inner surface side of the wiring layer 60 in the display area A and the inner surface side of the wiring layer 60 in the backside area C that are opposed to each other.

The second process is a filling process to fill the space on the inner surface side of the wiring layer 60 in the bent area B with liquid adhesive 92. This filling process includes the protecting sheet bonding process and the liquid adhesive injecting process.

In the protecting sheet bonding process, as illustrated in FIG. 10, a lateral surface protecting sheet 72 is bonded to the first lateral surface of the display panel 40. The lateral surface protecting sheet 72 is bonded thereto such that it at least covers the lateral surface of the wiring layer 60 disposed in the bent area B. In the present embodiment, it is bonded thereto such that it covers the range from the lateral surface of the wiring layer 60 disposed in the bent area B to the lateral side of the opposition space between the first protecting film 51 and the second protecting film 52 that are opposed to each other.

The liquid adhesive injecting process is, as illustrated in FIG. 11, the second lateral surface of the display panel 40 is arranged to face upward, and the liquid adhesive 92 is injected from this second lateral surface side of this display panel 40 into the space on the inner surface side of the wiring layer 60 in the bent area B. In the second manufacturing method of the present embodiment, the liquid adhesive 92 is injected into an area surrounded by the inner surface of the wiring layer 60 in the bent area B, an end part of the first protecting film 51, an end part of the second protecting film 52, and an end part of the double sided adhesive tape 80. As the liquid adhesive 92 to be injected thereinto, thermosetting resin, ultraviolet curable resin, or the like can be used. As the thermosetting resin, epoxy resin, phenol resin, silicone, and the like can be mentioned.

The third process is a curing process to cure the adhesive. In a case where in the liquid adhesive injecting process as described above the thermosetting resin is used as the liquid adhesive 92, by heating the whole of the display panel 40 or the liquid adhesive 92 filled part, the liquid adhesive 92 is cured, and the adhesive layer 90 as illustrated in FIG. 12 can be formed. In a case where ultraviolet curable resin is used as the liquid adhesive 92, by irradiating ultraviolet ray from the lateral surface protecting sheet 72 side, the second lateral surface side of the display panel 40 where the lateral surface protecting sheet 72 is not provided, or the like, the liquid adhesive 92 can be cured. In a case where the ultraviolet ray is irradiated from the lateral surface protecting sheet 72 side, it is preferable that the lateral surface protecting sheet 72 is formed of light transmitting material.

Lastly, by peeling off the lateral surface protecting sheet 72 and removing the bending jig 70, the display panel 40 as illustrated in FIG. 12 can be obtained. According to this manufacturing method, the configuration can be realized where the adhesive layer 90 fills the space on the inner surface side of the wiring layer 60 in the bent area B, and even when a stress is exerted thereon from the outer surface side of the bent area B, the deformation of the display device 2 can be suppressed, and the damage to the wiring layer 60 can be reduced. Further, even if downsizing of the display device 2 is advanced and the form of the inner surface side of the bent area B is miniaturized, the adhesive layer 90 that fits into that form can be formed.

Note that in a case where liquid adhesive 92 that is highly viscous is used in the filling process as described above, it may be configured that the liquid adhesive 92 is injected without providing the protecting sheet bonding process, and after the curing process a cutting process is provided where the adhesive layer 90 that extends farther than the lateral surface of the wiring layer 60 is cut off. In that case, the process to peel off the lateral surface protecting sheet 72 after the curing process is unnecessary.

As to the present embodiment, a case where the display device 2 is an organic electroluminescence display device has been given as an example, but the present disclosure can be applied to another display device such as a liquid crystal display device and other self-luminous display devices, and an electronic paper type display device with electrophoretic elements and the like, as long as they are configured to have the bent area B.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A manufacturing method of a display device, comprising:
   a display panel forming process to provide a plurality of pixels on a flexible base material and form a display area, and form a display panel that is provided with the flexible base material and the plurality of pixels and has a display area;
   a display panel bending process to bend a part adjacent to the display area of the display panel and form a bent area, and arrange a part opposite to the display area with respect to the bent area to be opposed to the display area and form a backside area;

a filling process to fill, by liquid adhesive, a space on the inner surface side that is in the bent area and that is the surface side of the display panel opposite to the surface on which the plurality of pixels are arranged on the flexible base material; and a curing process to cure the liquid adhesive and form an adhesive layer;

wherein the filling process comprises:

a protecting sheet bonding process to bond a lateral surface protecting sheet to a first lateral surface of the display panel and bond an opening part protecting sheet to an opening of an opposition space between the display area and the backside area that are opposed to each other to seal the opening; and an injection process to inject the liquid adhesive into the space on the inner surface side after the protecting sheet bonding process.

2. The manufacturing method of the display device according to claim 1, wherein the display panel has a second lateral surface that is opposed to the first lateral surface, and the injection process comprises:

arranging the second lateral surface to face upward, and injecting the liquid adhesive into the space on the inner surface side from a side where the second lateral surface exists.

3. The manufacturing method of the display device according to claim 1, wherein the lateral surface protecting sheet is bonded to at least a whole of a part positioned in the bent area, the part positioned in the bent area being included in the first lateral surface.

4. The manufacturing method of the display device according to claim 1, further comprising:

a cutting process to cut off a part of the adhesive layer that extends farther than a lateral surface of the display panel after the curing process.

5. A manufacturing method of a display device, comprising:

a display panel forming process to provide a plurality of pixels on a flexible base material and form a display area, and forma display panel that is provided with the flexible base material and the plurality of pixels and has a display area;

a display panel bending process to bend a part adjacent to the display area of the display panel and form a bent area and arrange a part opposite to the display area with respect to the bent area to be opposed to the display area and form a backside area;

a filling process to fill, by liquid adhesive, a space on the inner surface side that is in the bent area and that is the surface side of the display panel opposite to the surface on which the plurality of pixels are arranged on the flexible base material;

a curing process to cure the liquid adhesive and form an adhesive layer;

a bonding process to dispose a double sided adhesive tape in an opposition space between the display area and the backside area that are opposed to each other, and bond the display area and the backside area to each other, after the display panel bending process; and disposing a first protecting film on a side of the display area opposed to the backside area, and disposing a second protecting film on a side of the backside area opposed to the display area, wherein the double sided adhesive tape bonds the first protecting film and the second protecting film to each other.

6. A manufacturing method of a display device, comprising:

a display panel forming process to provide a plurality of pixels on a flexible base material and form a display area, and form a display panel that is provided with the flexible base material and the plurality of pixels and has a display area;

a display panel bending process to bend a part adjacent to the display area of the display panel and form a bent area, and arrange a part opposite to the display area with respect to the bent area to be opposed to the display area and form a backside area;

a filling process to fill, by liquid adhesive, a space on the inner surface side that is in the bent area and that is the surface side of the display panel opposite to the surface on which the plurality of pixels are arranged on the flexible base material;

a curing process to cure the liquid adhesive and form an adhesive layer;

a bonding process to dispose a double sided adhesive tape in an opposition space between the display area and the backside area that are opposed to each other, and bond the display area and the backside area to each other, after the display panel bending process; and a protecting sheet bonding process to bond a lateral surface protecting sheet to a first lateral surface of the display panel; and an injection process to inject the liquid adhesive into the space on the inner surface side after the protecting sheet bonding process.

7. The manufacturing method of the display device according to claim 6, wherein the display panel has a second lateral surface opposed to the first lateral surface, and the injecting process comprises:

arranging the second lateral surface to face upward, and injecting the liquid adhesive into the space on the inner surface side from a side where the second lateral surface exists.

8. The manufacturing method of the display device according to claim 6, wherein the lateral surface protecting sheet is bonded to at least a whole of a part positioned in the bent area, the part positioned in the bent area being included in the first lateral surface.

9. A display device comprising:

a display panel provided with a flexible base material and a plurality of pixels disposed on the flexible base material, and an adhesive layer that fixes the display panel in a bent state, wherein the display panel comprises:

a display area that includes the plurality of pixels;

a bent area that is adjacent to the display area and is bent; and a backside area that is positioned on a side opposite to the display area with respect to the bent area and is opposed to the display area, wherein the bent area has an inner surface that is a surface positioned opposite from the plurality of pixels of the flexible base material, the adhesive layer is adjacent to the inner surface and is positioned between the display area and the backside area, a first protecting film is positioned on a side of the display area opposed to the backside area;

a second protecting film is positioned on a side of the backside area opposed to the display area; and the adhesive layer is adjacent to the first protecting film and the second protecting film,
a double sided adhesive tape that is positioned between the first protecting film and the second protecting film, and bonds the first protecting film and the second protecting film to each other, wherein
the adhesive layer is adjacent to an end part of the inner surface side of the first protecting film, an end part of the inner surface side of the second protecting film, and an end part of the inner surface side of the double sided adhesive tape.

* * * * *